United States Patent
Fotouhi

(10) Patent No.: US 6,747,503 B2
(45) Date of Patent: Jun. 8, 2004

(54) CMOS TRANSMISSION GATE WITH HIGH IMPEDANCE AT POWER OFF

(75) Inventor: Bahram Fotouhi, Cupertino, CA (US)

(73) Assignee: Exar Corporation, Fremont, CA (US)

(*) Notice: Subject to any disclaimer, the term of this patent is extended or adjusted under 35 U.S.C. 154(b) by 0 days.

(21) Appl. No.: 10/119,101

(22) Filed: Apr. 8, 2002

(65) Prior Publication Data

US 2003/0189455 A1 Oct. 9, 2003

(51) Int. Cl.[7] .............................................. H03K 17/00
(52) U.S. Cl. ....................................... 327/365; 327/427
(58) Field of Search ................................. 327/365, 389, 327/391, 530, 534, 535, 537, 427, 433, 399, 403, 404; 326/21, 81

(56) References Cited

U.S. PATENT DOCUMENTS

| | | | |
|---|---|---|---|
| 5,563,540 A | * 10/1996 | Ashley et al. | 327/379 |
| 5,914,627 A | 6/1999 | Fotouhi | 327/404 |
| 5,926,056 A | 7/1999 | Morris et al. | 327/108 |
| 6,020,778 A | * 2/2000 | Shigehara et al. | 327/534 |
| 6,037,828 A | 3/2000 | Fotouhi | 327/404 |
| 6,268,759 B1 | * 7/2001 | Graves | 327/437 |
| 6,335,653 B1 | * 1/2002 | Shigehara et al. | 327/534 |

* cited by examiner

Primary Examiner—Linh M. Nguyen
(74) Attorney, Agent, or Firm—Townsend and Townsend and Crew LLP

(57) ABSTRACT

A transmission gate circuit with high impedance during power off conditions, which includes a first transistor coupled between a first terminal and a second terminal and a second transistor coupled between the first terminal and the second terminal. Also included is a control circuit configured to monitor voltages on the first terminal and on a first voltage source, the control circuit configured to couple the gates of the first and second transistors to a voltage that will keep the first and second transistors off during power off conditions.

5 Claims, 3 Drawing Sheets

CMOS TRANSMISSION GATE WITH HIGH IMPEDANCE AT POWER OFF

CROSS-REFERENCES TO RELATED APPLICATIONS

Not applicable

STATEMENT AS TO RIGHTS TO INVENTIONS MADE UNDER FEDERALLY SPONSORED RESEARCH OR DEVELOPMENT

Not applicable

REFERENCE TO A "SEQUENCE LISTING," A TABLE, OR A COMPUTER PROGRAM LISTING APPENDIX SUBMITTED ON A COMPACT DISK.

Not applicable

BACKGROUND OF THE INVENTION

The present invention relates generally to integrated circuits, and in particular to a versatile and efficient method and circuitry for transformer coupled transmission gates.

Transmission gates are integrated circuits developed for applications such as data or telecommunication systems are often required to comply with standardized interface specifications and will vary depending on the standard. A transmission gate receives a signal at its input terminal and outputs the signal at its output terminal. For transmission gates connected directly to input/output pads, a high-impedance state in the event of a power-failure condition, VDD=0V, is a necessary requirement for the transmission gate not to load any external circuitry connected to it at the input pad.

FIG. 1 is a conventional transmission gate 100. A transistor M50 and a transistor M51 constitute transmission gate 100 that passes a signal from an input terminal IN to an output terminal OUT when transmission gate is on. Transistor M50 is a PMOS transistor and Transistor M51 is an NMOS transistor.

Under normal operating conditions, e.g., VDD>0, internally generated control signals GATEN and GATEP turn transmission gate 100 on or off These signals could be coming from digital gates controlling the state of the transmission gate.

Under power-failure conditions, e.g., VDD=0V, control signals GATEN and GATEP drop to 0V. This turns transmission gate off. However, when the voltage at terminal IN becomes either more positive than the threshold voltage of the PMOS transistor M50 or more negative than the threshold voltage of NMOS transistor M51, transmission gate 100 turns on, effectively connecting terminal IN to terminal OUT.

More specifically, under power-failure conditions, there are two possible scenarios when the voltage at terminal IN becomes more positive than the threshold voltage of transistor M50. First, if the intrinsic pn diode between the source and bulk of transistor M50 turns on, it will short terminal IN to vdd which is at ground potential (control GATEP=0V). Second, the channel of the PMOS transistor M50 can simply turn on due to negative gate-to-source potential with gate at zero and source at positive potential.

Accordingly, transmission gate 100 does not always provide a high-impedance mode at input terminal IN under power-failure conditions. Thus, there is a need for a transmission gate circuit that remains off during power-failure conditions even if the voltage at terminal IN becomes more positive than the threshold voltage of the PMOS transistor of the transmission gate. Similar conditions hold for negative voltage at terminal IN and the NMOS transistor M51. In that either the diode D1 or the channel of M51 will turn on shorting input terminal IN to ground or output terminal, respectively.

BRIEF SUMMARY OF THE INVENTION

The present invention provides a method and circuitry for a transmission gate with high impedance during power off conditions. In accordance with the teachings of the invention, included is a first transistor coupled between a first terminal and a second terminal and a second transistor coupled between the first terminal and the second terminal. A control circuit is configured to monitor voltages on the first terminal and on a first voltage source. The control circuit is also configured to couple the gates of the first and second transistors to a voltage that will keep the first and second transistors off during power off conditions. The control circuit ensures that the first and second transistors remain off during power off conditions even when the voltage levels at the first terminals vary widely.

In one embodiment, a first bias circuit couples between the gate of the first transistor and the first control node, and a second bias circuit couples between the gate of the second transistor and the second control node.

In another embodiment, the control circuit includes a well bias circuit that is configured to bias the first bias circuit.

In another embodiment, the well bias circuit and the first bias circuit include a plurality of PMOS transistors. The well bias circuit is configured to couple a common n-well node at the most positive voltage.

Embodiments of the present invention achieve their purposes and benefits in the context of known circuit and process technology and known techniques in the electronic and process arts. Further understanding, however, of the nature, features, and advantages of the present invention is realized by reference to the latter portions of the specification, accompanying drawings, and appended claims.

DETAILED DESCRIPTION OF THE INVENTION

Figure 1:
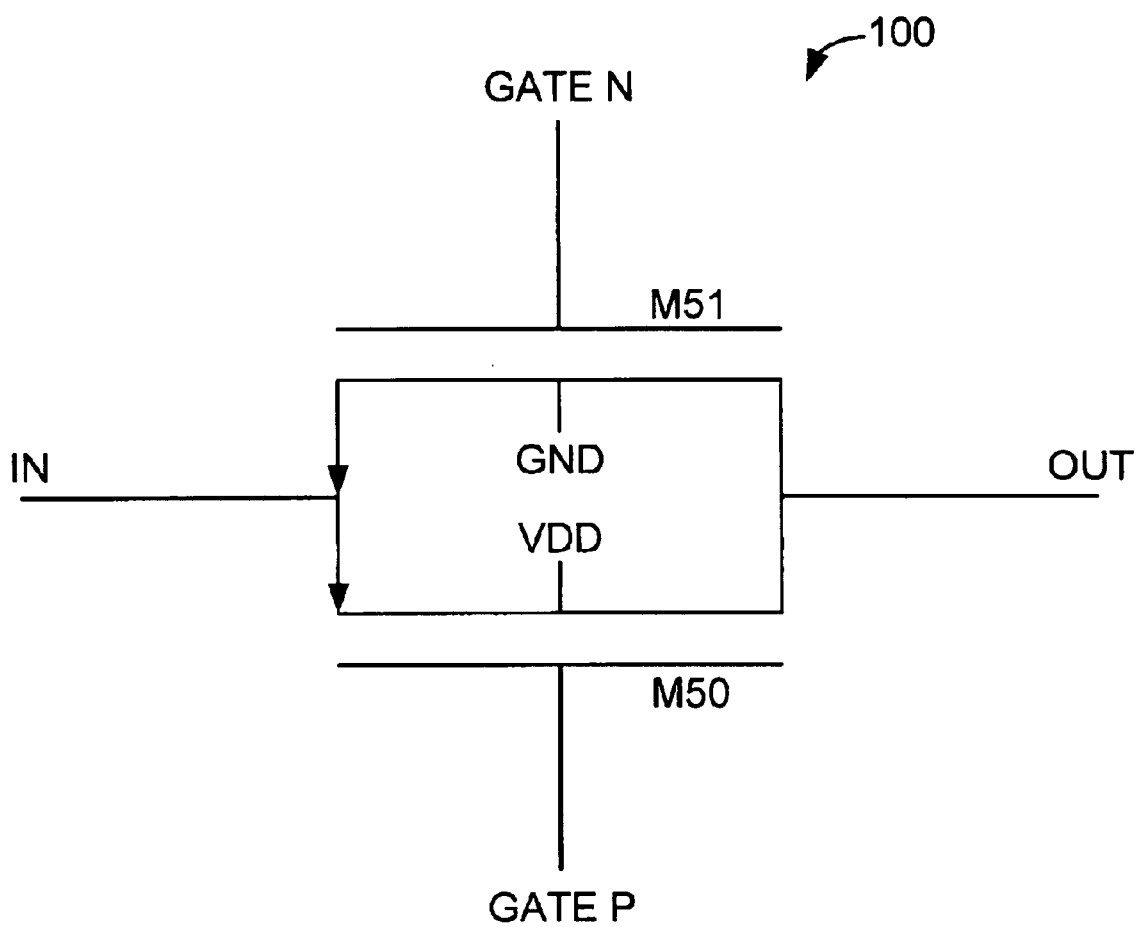
FIG. 1 is a conventional transmission gate.
Figure 2:
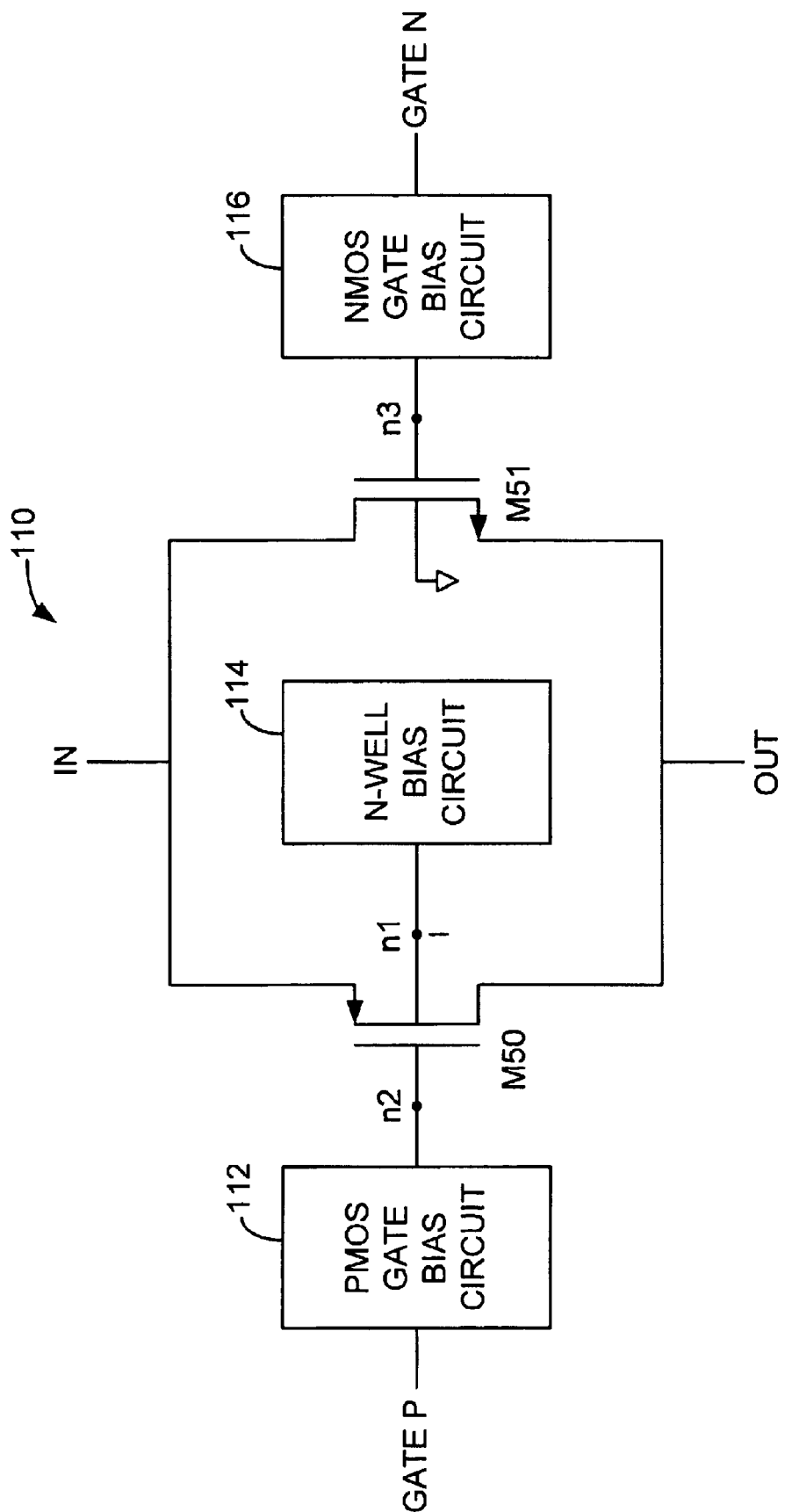
FIG. 2 is a simplified high-level block diagram of a transmission gate, according to one embodiment of the present invention.

FIG. 2 is a simplified high-level block diagram of a transmission gate, according to one embodiment of the present invention. Transmission gate 110 functions as a high-impedance transmission gate between an input terminal IN and an output terminal OUT. Input terminal IN is the input to transmission gate 110 and is ac coupled to an input pad (not shown) via a transformer (not shown). Output terminal OUT is the output of transmission gate and is an internal node. Transmission gate 110 includes transistors M50 and M51. In this specific embodiment, transistors M50 and M51 are PMOS and NMOS transistors, respectively.

Transmission gate 110 includes a control circuit that couples the gates of the transistors M50 and M51 to control signals GATEP and GATEN, respectively. Transmission gate 110 includes a PMOS gate bias circuit 112, an N-well bias circuit 114, and a NMOS gate bias circuit 116. N-well bias circuit 114 couples to the n-well of transistor M50 (node 1) and biases n-well of the PMOS transistor. PMOS gate bias circuit 112, which couples the gate of transistor M50 (node 2) to control signal GATEP. NMOS gate bias circuit 116 couples the gate of transistor M51 (node 3) to control signal GATEN.

Under normal operating conditions, e.g., VDD >0V, the state of transmission gate 110, i.e., on or off, is controlled by control signals GATEP and GATEN at the gates of transistors M50 and M51, respectively.

Under power-failure conditions, i.e., VDD=0, transmission gate 110 goes into a high-impedance mode, providing a high-impedance between terminals IN and OUT to prevent the loading of any driving circuitry that might be connected at input terminal IN.

More specifically, the control circuit decouples the gates of the transistors M50 and M51 from control signals GATEP and GATEN, respectively, and pulls the gates to a voltage that will turn transistors M50 and M51 off. PMOS gate bias circuit 112 ensures that transistor M50 remains off by decoupling its gate from control signal GATEP and pulling the gate to the most positive voltage available. NMOS gate bias circuit 112 ensures that transistor M51 remains off by decoupling its gate from control signal GATEN and pulling the gate to the most negative voltage available.

Figure 3:
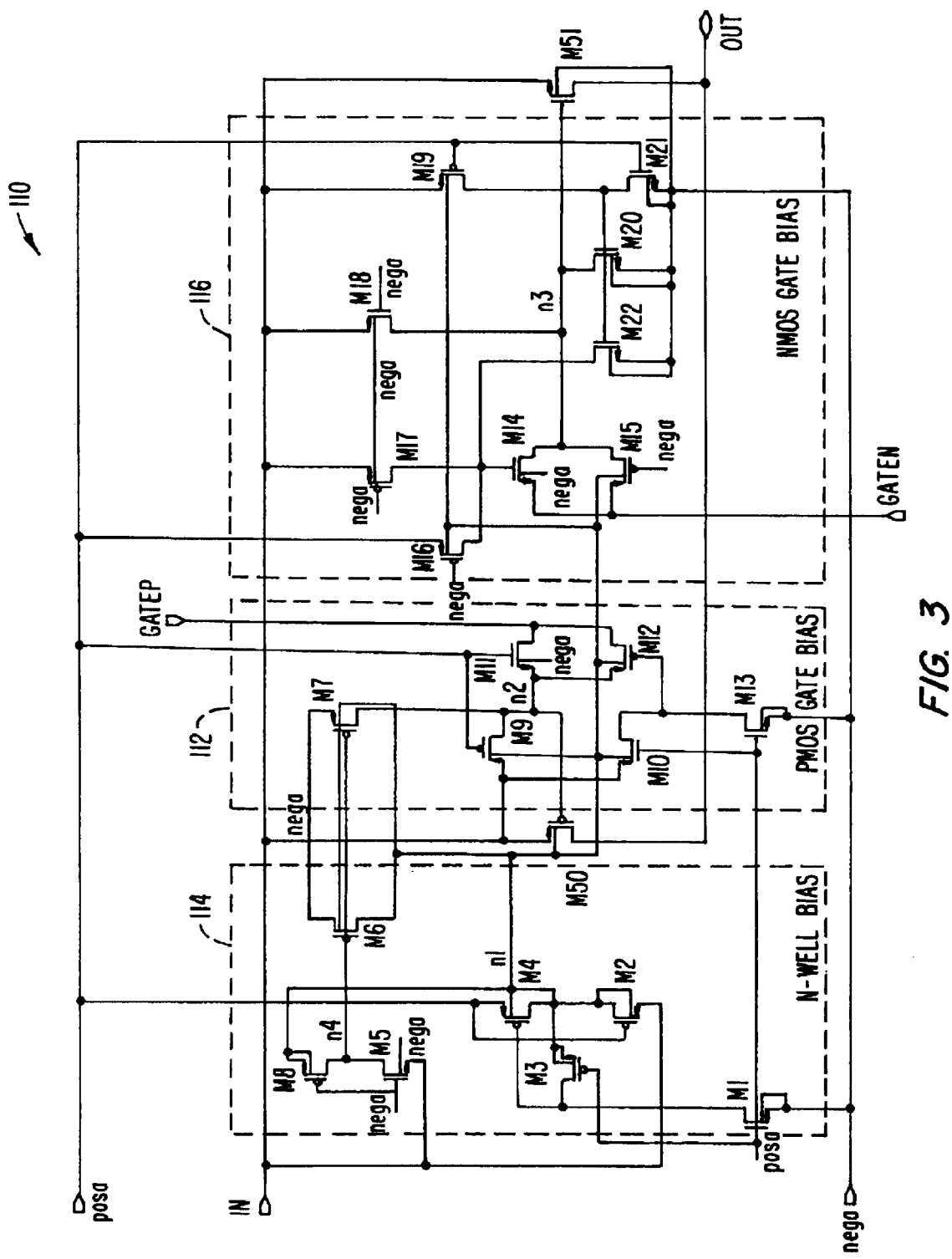
FIG. 3 is a schematic diagram of the transmission gate of FIG. 2, showing the details of PMOS gate bias circuit 112, N-well bias circuit 114, and NMOS gate bias circuit 116.

FIG. 3 is a schematic diagram of the transmission gate of FIG. 2, showing the details of PMOS gate bias circuit 112, N-well bias circuit 114, and NMOS gate bias circuit 116.

Transmission gate 110 is described below under three conditions: VDD>0 (normal operating conditions), VDD=0 and IN>0 (power-failure conditions), and VDD=0 and IN <0 (power-failure conditions).

VDD>0V

During normal operating conditions, e.g., VDD>0V, transmission gate circuit 110 functions as a transmission gate composed of transistors M50 and M51. More specifically, transistors M11 and M12 are on and couple the gate of transistor M50 (node 2) to control signal GATEP. Moreover, transistors M14 and M15 are on and couple the gate of transistor M51 (node 3) to control signal GATEN.

Referring to N-well bias circuit 114, transistors M1, M4, and M8 are on, and transistors M2, M3, and M5, M6, and M7 are off. Specifically, transistor M1, being on, pulls the gate of transistor M4 to ground turning it on. When transistor M4 is on, common n-well node n1 of the PMOS transistors couples to VDD. When common n-well node n1 couples to VDD, node n4 is pulled to VDD via transistor M8, turning off transistors M6 and M7. The bulk of transistor M50 couples to VDD via common n-well node n1.

Transistors M1-M6 and bias the common n-well of all the PMOS transistors.

Referring to PMOS gate bias circuit 112, transistors M11, M12, and M13 are on, and transistors M9 and M10 are off. Transistor M13, being on, pulls the gate of transistor M12 to ground turning it on. Transistor M11 is on because its gate is coupled to VDD. Transistors M11 and M12, being on, couple the gate of transistor M50 (node 2) to control signal GATEP.

Referring to NMOS gate bias circuit 116, transistors M14, M15, M16, and M21 are on, and transistors M17, M18, M20, and M22 are off. Transistor M16, being on, pulls the gate of transistor M14 to VDD turning it on. Transistors M14 and M15, being on, couple the gate of transistor M51 (node 3) to control signal GATEN.

VDD=0V and IN>0V

Under power-failure conditions, e.g., VDD=0V, PMOS gate bias circuit 112 ensures that transistor M50 remains off by decoupling its gate from control signal GATEP and pulling the gate high, and NMOS gate bias circuit 116 ensure that transistor M51 remains off by decoupling its gate from control signal GATEN and pulling the gate low. As will be describe in more detail below, this remains true regardless of the voltage at terminal IN, e.g., IN>0V or IN<0V. The condition where IN>0V first discussed, and the condition where IN<0V is discussed further below.

The gate of transistor M50 is pulled to the most positive voltage. This ensures that the channel of transistor M50 remains off and current does not flow through its channel. Similarly, the gate of transistor M51 is pulled to the most negative voltage. This ensures that the channel of transistor M51 remains off and current does not flow through its channel.

Referring to PMOS gate bias circuit 112, transistors M9, and M10, with their gates at ground and sources at positive potential, are on, and transistors M7, M11, M12, M13, and M50 are off. Transistors M9 and M10, being on, connect node n2 and the gate of transistor M12, respectively, to input terminal IN. This turns off transistor M12. Transistors M11 and M12, being off, decouple the gate of transistor M50 from control signal GATEP. Transistor M50 is kept off because its gate is pulled to the most positive voltage. Here, the most positive voltage is the voltage input terminal IN.

Referring to N-well bias circuit 114, transistors M2, M3, and M8 are on, and transistors M1, M4, M5, and M6 are off. Transistor M2 turns on as soon as the voltage at the input terminal IN exceeds a PMOS threshold voltage. Transistor M2, being on, couples common n-well node n1 to node IN. As a result, the common n-well node n1 is biased at the most positive voltage. Here, the most positive voltage is the voltage input terminal IN. Transistor M3, being on, shorts the source of transistor M4 to its gate thus turning it off. Transistor M8, being on, connects common n-well node n1 to node n4 shutting off transistors M6 and M7 (of PMOS gate bias circuit 112).

Referring to NMOS gate bias circuit 116, and transistors M19, M20, and M22 are on, and transistors M14–M18, M21, and M51 are off. Transistor M19, being on, pulls the gate of transistors M20 and M22 to the positive voltage of terminal IN, thus turning them on and pulling the gates of M51 and M14 to ground to turn them off. Transistors M14 and M15, being off, decouple the gate of transistor M51 (node 3) from control signal GATEN. Transistor M51 is kept off because its gate is pulled to the most negative voltage present. Here, the most negative voltage is ground.

As a result, the gates of transistors M50 and M51 are isolated from control signals GATEP and GATEN. Moreover, transistors M50 and M51 are kept off because their gates are connected to the most positive and most negative voltage present, respectively.

VDD=0V and IN<0V

Referring to PMOS gate bias circuit 112 and N-well bias circuit 114, transistors M5–M7 are on, and transistors M1–M3, M8–M13, and M50 are off. Transistors M11 and M12, being off, decouple the gate of transistor M50 from control node GATEP. Transistor M5, being on, pulls node n4 to the negative voltage present on input terminal IN. This turns on transistors M6 and M7, biasing the gate of transistor M50 at ground potential (highest potential), keeping transistor M50 off. Also, transistors M6 and M7, being on, bias common n-well node 1 at ground potential (highest potential), keeping the intrinsic diode at the pn junction between the source and bulk of transistor M50 off.

Referring to NMOS gate bias circuit 116, transistors M17 and M18 are on, and transistors M14–M16, M19, M20, M22 and M51 are off. Transistors M17 and M18, being on, pull the gates of transistors M14 and M51 to the negative input potential of terminal IN keeping them off. Transistors M14 and M15, being off, decouple the gate of transistor M51 from control node GATEP.

Therefore, when VDD=0V, for positive and negative deviations at terminal IN, i.e., IN>0V and IN<0V, the gates of transistors M50 and M51 are isolated from control signals GATEP and GATEN. Moreover, transistors M50 and M51 are kept off because their gates are connected to the most positive and most negative voltage present, respectively.

With VDD=0 and IN<0, the source-to-bulk pn-diodes of the NMOS transistors will be forward biased connecting input terminal IN to the common p+ bulk of the integrated circuit which is connected to ground. Since input IN is presumed to be floating with respect to ground, i.e., terminal IN is ac coupled either through a transformer to the external signal, there will not be a closed path from terminal IN to ground for a current to flow. Thus the forward biasing of the substrate diodes will not reduce the high-impedance presented at terminal IN.

Conclusion

In conclusion, it can be seen that embodiments of the present invention provide numerous advantages. Principally, they ensure that the transmission gate remains at a high impedance, i.e., off, during power-failure conditions. Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art and are intended to be within the scope of this invention. Therefore, it is not intended to be exhaustive or to limit the invention to the specific embodiments described, but is intended to be accorded the widest scope consistent with the principles and novel features disclosed herein, and as defined by the following claims.

What is claimed is:

1. A transmission gate circuit comprising:
    a first transistor coupled between a first terminal and a second terminal;
    a second transistor coupled between the first terminal and the second terminal; and
    a control circuit configured to monitor voltages on the first terminal and on a first voltage source, wherein the control circuit is configured to couple the gates of the first and second transistors to a voltage that will keep the first and second transistor off during power off conditions, wherein the control circuit further comprises a will bias circuit configured to bias a first bias circuit, wherein the first bias circuit comprises:
        a third transistor and a fourth transistor coupled in parallel between a first control node and the gate of the first transistor;
        a fifth transistor coupled between the source of the third transistor and the first terminal, the fifth transistor having a gate coupled to the gate of the third transistor;
        a sixth transistor coupled between gate of the fourth transistor and the first terminal, the sixth transistor having a gate coupled to the first voltage source;
        a seventh transistor coupled between the gate of the fourth transistor and a second voltage source, the seventh transistor having a gate coupled to the first voltage source; and
        an eighth transistor coupled between the second voltage source and a common well node.

2. The transmission gate circuit of claim 1 wherein the well bias circuit and the first bias circuit comprise a plurality of PMOS transistors, and wherein the well bias circuit is configured to couple a common n-well node at the most positive voltage.

3. A transmission gate circuit comprising:
    a first transistor coupled between a first terminal and a second terminal;
    a second transistor coupled between the first terminal and the second terminal; and
    a control circuit configured to monitor voltage on the first terminal and on a first voltage source, wherein the control circuit is configured to couple the gates of the first and second transistor to a voltage that will keep the first and second transistors off during power off conditions, wherein the control circuit includes
    a first bias circuit coupled between the gate of the first transistor and a first control node; and
    a second bias circuit coupled between the gate of the second transistor and a second control node;
    wherein during normal operating conditions, the control circuit couples the gate of the first transistor to the first control node and couples the gate of the second transistor to the second control node, and wherein during power off conditions, the control circuit decouples the gates of the first and second transistors from their respective control nodes;
    wherein the first bias circuit comprises:
        a third transistor and a fourth transistor coupled in parallel between the first control node and the gate of the first transistor;
        a fifth transistor coupled between the source of the third transistor and the first terminal, the fifth transistor having a gate coupled to the gate of the third transistor;
        a sixth transistor coupled between gate of the fourth transistor and the first terminal, the sixth transistor having a gate coupled to the first voltage source;
        a seventh transistor coupled between the gate of the fourth transistor and a second voltage source, the seventh transistor having a gate coupled to the first voltage source; and
        an eighth transistor coupled between the second voltage source and a common well node.

4. A transmission gate circuit comprising:
    a first transistor coupled between a first terminal and a second terminal;
    a second transistor coupled between the first terminal and the second terminal; and
    a control circuit configured to monitor voltages on the first terminal and on a first voltage source, wherein the control circuit is configured to couple the gates of the first and second transistors to a voltage that will keep the first and second transistors off during power off conditions, wherein the control circuit includes
    a first bias circuit coupled between the gate of the first transistor and a first control node; and a second bias circuit coupled between the gate of the second transistor and a second control node;

wherein during normal operating conditions, the control circuit couples the gate of the first transistor to the first control node and couples the gate of the second transistor to the second control node, and wherein during power off conditions, the control circuit decouples the gates of the first and second transistors from their respective control nodes;

wherein the second bias circuit comprises:
- a ninth transistor and a tenth transistor coupled in parallel between the second control node and the gate of the second transistor;
- an eleventh transistor coupled between the first voltage source and the gate of the ninth transistor, the eleventh translator having a gate coupled to the second voltage source;
- a twelfth transistor coupled between gate of the ninth transistor and the second voltage source;
- a thirteenth transistor coupled between the gate of the second transistor and the second voltage source, the thirteenth transistor having a gate coupled to the gate of the twelfth transistor;
- a fourteenth transistor coupled between the gate of the thirteenth transistor and the second voltage source, the fourteenth transistor having a gate coupled to the first voltage source;
- a fifteenth transistor coupled between the first terminal and the gate of the ninth transistor, the fifteenth transistor having a gate coupled to the second voltage source;
- a sixteenth transistor coupled between the first terminal and the gate of the second transistor, the sixteenth transistor having a gate coupled to the second voltage source; and
- a seventeenth transistor coupled between the first terminal and the gate of the thirteenth transistor, the seventeenth transistor having a gate coupled to the first voltage source.

5. A transmission gate circuit comprising:

a first transistor coupled between a first terminal and a second terminal;

a second transistor coupled between the first terminal and the second terminal; and a control circuit configured to monitor voltage on the first terminal and on a first voltage source, wherein the control circuit is configured to couple the gates of the first and second transistors to a voltage that will keep the first and second transistors off during power off conditions, wherein the control circuit includes a first bias circuit coupled between the gate of the first transistor and a first control node; and a second bias circuit coupled between the gate of the second transistor and a second control node;

wherein during normal operating conditions, the control circuit couples the gate of the first transistor to the first control node and couples the gate of the second transistor to the second control node, and wherein during power off conditions, the control circuit decouples the gates of the first and second transistors from their respective control nodes;

wherein the well bias circuit comprises:
- an eighteenth transistor and a nineteenth transistor coupled in series between the first voltage source and the first terminal, the nineteenth transistor having a gate coupled to the first voltage source;
- a twentieth transistor coupled between the drain and the gate of the eighteenth transistor, the nineteenth transistor having a gate coupled to the first voltage source;
- a twenty-first transistor coupled between the gate of the eighteenth transistor and the second voltage source, the twenty-first transistor having a gate coupled to the first voltage source;
- a twenty-second transistor coupled between the second voltage source and the common well node, the common well node being coupled between the eighteenth and the nineteenth transistors; and
- a twenty-third transistor and a twenty-fourth transistor coupled in series between the common well node and the first terminal, the twenty-third transistor and a twenty-fourth transistor having a gate coupled to the second voltage source.

* * * * *